US008360606B2

(12) United States Patent
Takei et al.

(10) Patent No.: US 8,360,606 B2
(45) Date of Patent: Jan. 29, 2013

(54) LIGHT-EMITTING DEVICE AND ILLUMINATION DEVICE

(75) Inventors: Haruki Takei, Yokosuka (JP); Seiko Kawashima, Yokosuka (JP); Tsuyoshi Oyaizu, Yokosuka (JP); Yasunori Yamaguchi, Yokosuka (JP)

(73) Assignees: Toshiba Lighting & Technology Corporation, Kanagawa (JP); Kabushiki Kaisha Toshiba, Tokyo (JP)

( * ) Notice: Subject to any disclaimer, the term of this patent is extended or adjusted under 35 U.S.C. 154(b) by 206 days.

(21) Appl. No.: 12/880,490

(22) Filed: Sep. 13, 2010

(65) Prior Publication Data

US 2011/0063842 A1 Mar. 17, 2011

(30) Foreign Application Priority Data

Sep. 14, 2009 (JP) .................. 2009-212502
Jul. 30, 2010 (JP) .................. 2010-172717

(51) Int. Cl.
*F21V 29/00* (2006.01)
*F21S 4/00* (2006.01)

(52) U.S. Cl. .............. 362/249.01; 362/294; 362/396; 362/218; 362/373; 362/249.02

(58) Field of Classification Search ............ 362/249.01, 362/249.02, 218, 294, 373, 396
See application file for complete search history.

(56) References Cited

U.S. PATENT DOCUMENTS

| | | | |
|---|---|---|---|
| 4,355,853 A | 10/1982 | Kourimsky | |
| D356,107 S | 3/1995 | Watanabe et al. | |
| 5,537,301 A | 7/1996 | Martich | |
| 5,775,792 A | 7/1998 | Wiese | |
| 5,785,418 A | 7/1998 | Hochstein | |
| 5,857,767 A | 1/1999 | Hochstein | |
| 6,095,668 A | 8/2000 | Rykowski et al. | |
| 6,517,217 B1 | 2/2003 | Liao | |
| 6,814,470 B2 | 11/2004 | Rizkin et al. | |
| 6,936,855 B1 | 8/2005 | Harrah | |
| 6,948,829 B2 | 9/2005 | Verdes et al. | |
| 6,982,518 B2 | 1/2006 | Chou et al. | |
| 7,144,140 B2 | 12/2006 | Sun et al. | |

(Continued)

FOREIGN PATENT DOCUMENTS

CN 1644978 7/2005
DE 10 2004 042186 3/2006

(Continued)

OTHER PUBLICATIONS

U.S. Appl. No. 13/172,557, filed Jun. 29, 2011, Pending.

(Continued)

*Primary Examiner* — Stephen F Husar
*Assistant Examiner* — James Cranson, Jr.
(74) *Attorney, Agent, or Firm* — DLA Piper LLP (US)

(57) ABSTRACT

According to one embodiment, a light-emitting device includes a ceramic substrate, a plurality of light-emitting elements, and pressure member. The substrate includes a first surface in contact with a thermally radiative member, a second surface positioned in a side opposite to the first surface, and an outer circumferential surface which bridges outer circumferential edges of the first surface and the second surface. The light-emitting elements are mounted on the second surface of the substrate. The pressure member elastically press the substrate toward the thermally radiative member. A gap is provided between the pressure member and the outer circumferential surface of the substrate.

7 Claims, 8 Drawing Sheets

U.S. PATENT DOCUMENTS

| | | | |
|---|---|---|---|
| D534,665 S | 1/2007 | Egawa et al. | |
| D535,038 S | 1/2007 | Egawa et al. | |
| 7,198,387 B1 | 4/2007 | Gloisten et al. | |
| 7,226,189 B2 | 6/2007 | Lee et al. | |
| 7,331,689 B2 | 2/2008 | Chen | |
| 7,347,589 B2 | 3/2008 | Ge | |
| 7,431,477 B2 | 10/2008 | Chou et al. | |
| 7,497,596 B2 | 3/2009 | Ge | |
| 7,625,104 B2 * | 12/2009 | Zhang et al. | 362/294 |
| 7,744,256 B2 * | 6/2010 | Smester | 362/362 |
| 7,919,339 B2 | 4/2011 | Hsu | |
| 8,157,418 B2 * | 4/2012 | Kraus | 362/294 |
| 2003/0137838 A1 | 7/2003 | Rizkin et al. | |
| 2004/0109310 A1 | 6/2004 | Galli | |
| 2004/0120156 A1 | 6/2004 | Ryan | |
| 2004/0145898 A1 | 7/2004 | Ase et al. | |
| 2004/0218385 A1 | 11/2004 | Tomiyoshi | |
| 2005/0024864 A1 | 2/2005 | Galli | |
| 2005/0068776 A1 | 3/2005 | Ge | |
| 2005/0073244 A1 | 4/2005 | Chou et al. | |
| 2005/0111234 A1 | 5/2005 | Martin et al. | |
| 2005/0162864 A1 | 7/2005 | Verdes et al. | |
| 2006/0043546 A1 | 3/2006 | Kraus | |
| 2006/0092640 A1 | 5/2006 | Li | |
| 2006/0193130 A1 | 8/2006 | Ishibashi | |
| 2006/0193139 A1 | 8/2006 | Sun | |
| 2006/0198147 A1 | 9/2006 | Ge | |
| 2006/0215408 A1 | 9/2006 | Lee | |
| 2006/0227558 A1 | 10/2006 | Osawa et al. | |
| 2006/0239002 A1 | 10/2006 | Chou et al. | |
| 2007/0041182 A1 | 2/2007 | Ge et al. | |
| 2007/0096114 A1 | 5/2007 | Aoki | |
| 2008/0037255 A1 | 2/2008 | Wang | |
| 2009/0059595 A1 | 3/2009 | Ge | |
| 2009/0207602 A1 | 8/2009 | Reed | |
| 2010/0026157 A1 | 2/2010 | Tanaka | |
| 2010/0096992 A1 | 4/2010 | Yamamoto | |
| 2010/0219735 A1 | 9/2010 | Sakai et al. | |
| 2010/0225220 A1 | 9/2010 | Tanaka et al. | |
| 2010/0237761 A1 | 9/2010 | Osawa et al. | |
| 2010/0237779 A1 | 9/2010 | Osawa et al. | |
| 2010/0244650 A1 | 9/2010 | Osawa et al. | |
| 2010/0244694 A1 | 9/2010 | Osawa et al. | |
| 2010/0253200 A1 | 10/2010 | Osawa et al. | |
| 2010/0289393 A1 | 11/2010 | Cantrell et al. | |
| 2010/0289396 A1 | 11/2010 | Osawa | |
| 2010/0327746 A1 | 12/2010 | Hisayasu | |
| 2010/0327751 A1 | 12/2010 | Takenaka et al. | |
| 2011/0025206 A1 | 2/2011 | Hiramatsu et al. | |
| 2011/0063842 A1 | 3/2011 | Takei et al. | |
| 2011/0068674 A1 | 3/2011 | Takenaka et al. | |
| 2011/0074269 A1 | 3/2011 | Hisayasu et al. | |
| 2011/0074271 A1 | 3/2011 | Takeshi et al. | |
| 2011/0074290 A1 | 3/2011 | Sakai et al. | |
| 2011/0074291 A1 | 3/2011 | Osawa et al. | |
| 2011/0089806 A1 | 4/2011 | Suwa et al. | |
| 2011/0090691 A1* | 4/2011 | Markle et al. | 362/249.02 |
| 2011/0156569 A1 | 6/2011 | Osawa | |
| 2011/0210664 A1 | 9/2011 | Hisayasu et al. | |

FOREIGN PATENT DOCUMENTS

| | | |
|---|---|---|
| DE | 20 2008 016 231 | 4/2009 |
| EP | 1705421 | 9/2006 |
| EP | 2149742 | 2/2010 |
| JP | 57-152706 | 9/1982 |
| JP | 59-035303 | 2/1984 |
| JP | 61-36216 | 2/1986 |
| JP | 62-190366 | 12/1987 |
| JP | 63-5581 | 1/1988 |
| JP | 63-102265 | 5/1988 |
| JP | 64-7204 | 1/1989 |
| JP | 1-206505 | 8/1989 |
| JP | 2-91105 | 3/1990 |
| JP | 2000-083343 | 3/2000 |
| JP | 2000-173303 | 6/2000 |
| JP | 2001-243809 | 9/2001 |
| JP | 2002-525814 | 8/2002 |
| JP | 2002-280617 | 9/2002 |
| JP | 2003-016808 | 1/2003 |
| JP | 2003-059305 | 2/2003 |
| JP | 2003-59330 | 2/2003 |
| JP | 2003-92022 | 3/2003 |
| JP | 2004-6096 | 1/2004 |
| JP | 2004-193053 | 7/2004 |
| JP | 2004-221042 | 8/2004 |
| JP | 2005-93097 | 4/2005 |
| JP | 2005-123200 | 5/2005 |
| JP | 2005-513815 | 5/2005 |
| JP | 2005-166578 | 6/2005 |
| JP | 2005-217354 | 8/2005 |
| JP | 2005-286267 | 10/2005 |
| JP | 2006-040727 | 2/2006 |
| JP | 3121916 | 5/2006 |
| JP | 2006-156187 | 6/2006 |
| JP | 2006-244725 | 9/2006 |
| JP | 2006-28646 | 10/2006 |
| JP | 2006-310057 | 11/2006 |
| JP | 2006-313717 | 11/2006 |
| JP | 2006-313718 | 11/2006 |
| JP | 2007-073306 | 3/2007 |
| JP | 2007-188832 | 7/2007 |
| JP | 2007-207576 | 8/2007 |
| JP | 2008-027910 | 2/2008 |
| JP | 2008-91140 | 4/2008 |
| JP | 2008-227412 | 9/2008 |
| JP | 2008-277561 | 11/2008 |
| JP | 2009-37995 | 2/2009 |
| JP | 2009-135026 | 6/2009 |
| JP | 2009-206104 | 8/2009 |
| WO | WO 03/056636 | 7/2003 |
| WO | WO 2005/024898 | 3/2005 |
| WO | WO 2008/146694 | 12/2008 |
| WO | WO2009/085231 | 7/2009 |
| WO | WO 2009/087897 | 7/2009 |

OTHER PUBLICATIONS

U.S. Appl. No. 13/221,519, filed Aug. 30, 2011, Pending.
U.S. Appl. No. 13/221,551, filed Aug. 30, 2011, Pending.
English Language Abstract of JP 2001-243809, published Sep. 7, 2001.
English Language Abstract of JP Publication 01-206505 published Aug. 18, 1989.
English Language Abstract of JP Publication 2005-093097 published Apr. 7, 2005.
English Language Abstract of JP Publication 2005-123200 published May 12, 2005.
English Language Abstract of JP 2006-313718, published Nov. 16, 2006.
English Language Abstract of JP Publication 63-005581 published Jan. 11, 1988.
English Language Abstract of JP Publication 64-007402 published Jan. 11, 1989.
English Language Machine Translation of JP 2000-083343, published Mar. 21, 2000.
English Language Machine Translation of JP 2000-173303 published Jun. 23, 2000.
English Language Machine Translation of JP 2001-243809, published Sep. 7, 2001.
English Language Machine translation of JP 2003-59330 published Feb. 28, 2003.
English Language Machine Translation of JP 2004-006096 published Jan. 8, 2004.
English Language Machine Translation of JP 2004-193053 published Jul. 8, 2004.
English Language Machine Translation of JP 2005-166578 published Jun. 23, 2005.
English Language Machine translation of JP 2005-513815 published May 12, 2005.
English Language Machine translation of JP 2006-040727 published Feb. 9, 2006.
English Language Machine Translation of JP 2006-310057, published Nov. 9, 2006.

English Language Machine Translation of JP 2006-313718, published Nov. 16, 2006.
English Language Machine translation of JP 2008-91140 published Apr. 17, 2008.
English Language Machine Translation of JP 2009-37995, published Feb. 19, 2009.
English Language Machine Translation of JP 312916, published May 10, 2006.
English Language Machine Translation of JP Publication 2005-093097 published Apr. 7, 2005.
English Language Machine Translation of JP 2005-123200 published May 12, 2005.
English Language Machine translation of JP-2002-280617published Sep. 27, 2002.
English Language Machine translation of JP-2005-286267 published Oct. 13, 2005.
English Language Machine translation of JP-2006-244725 published Sep. 14, 2006.
English Language Machine Translation ofJP 2003-092022 published Mar. 28, 2003.
English Language Translation of Office Action issued in corresponding Japanese Appl 2005-221571 on Oct. 20, 2009.
English Language Translation of International Search Report for PCT/JP2008/073436 mailed Mar. 24, 2009.
English translation of Office Action issued in corresponding Japanese Appl 2005-221571 on Jul. 7, 2009.
English translation of Office Action issued in corresponding Japanese Appl 2005-221571 on Aug. 25, 2009.
English Language Translation of Office Action issued in Japanese Appl 2005-221688 on Jan. 26, 2010.
Machine English language translation of JP-2003-016808 published Jan. 17, 2003.
Office Action issued in corresponding Japanese Appl 2005-221571 on Jul. 7, 2009.
Office Action issued in corresponding Japanese Appl 2005-221571 on Aug. 25, 2009.
Office Action issued in corresponding Japanese Appl 2005-221571 on Oct. 20, 2009.
Search Report of International Application No. PCT/JP2008/068625 mailed Dec. 9, 2008.
English Language Abstract of JP 2004-193053 published Jul. 8, 2004.
English Language Abstract of JP 2-91105 published Mar. 30, 1990.
English Language Abstract of JP 2000-173303 published Jun. 23, 2000.
English Language Abstract of JP 2003-092022 published Mar. 28, 2003.
English language abstract of JP-2002-280617 published Sep. 27, 2002.
English language abstract of JP-2003-016808 published Jan. 17, 2003.
English Language Abstract of 2003-59330 published Feb. 28, 2003.
English Language Abstract of JP 2005-166578 published Jun. 23, 2005.
English language abstract of JP-2005-286267 published Oct. 13, 2005.
English Language Abstract of JP 2006-040727 published Feb. 9, 2006.
English language abstract of JP-2006-244725 published Sep. 14, 2006.
English Language Abstract of JP 2008-91140 published Apr. 17, 2008.
English Language Abstract of JP 2004-006096 published Jan. 8, 2004.
Office Action issued in Japanese Appl 2005-221688 on Jan. 26, 2010.
English Language Abstract of JP 2009-37995, published Feb. 19, 2009.
English Language Abstract of JP 2000-083343, published Mar. 21, 2000.
English Language Abstract of JP 57-152706 published Sep. 21, 1982.
English Language Abstract of JP 2006-310057, published Nov. 9, 2006.
International Preliminary Report on Patentability and Written Opinion issued in PCT/JP2008/068625 mailed May 11, 2010.
Office Action issued in Japanese Appl 2005-371406 on Apr. 20, 2010.
English Translation of Office Action issued in Japanese Appl 2005-371406 on Apr. 20, 2010.
U.S. Appl. No. 12/825,650 captured on Apr. 15, 2011.
U.S. Appl. No. 12/794,379 captured on Apr. 15, 2011.
U.S. Appl. No. 12/794,429 captured on Apr. 15, 2011.
U.S. Appl. No. 12/794,476 captured on Apr. 15, 2011.
U.S. Appl. No. 12/794,509 captured on Apr. 15, 2011.
U.S. Appl. No. 12/794,558 captured on Apr. 15, 2011.
U.S. Appl. No. 12/811,795 captured on Apr. 15, 2011.
U.S. Appl. No. 12/738,081 captured on Apr. 15, 2011.
U.S. Appl. No. 12/713,230 captured on Apr. 15, 2011.
U.S. Appl. No. 12/825,956 captured on Apr. 15, 2011.
Japanese Office Action issued in JP 2008-198625 on May 26, 2010.
English Translation of Japanese Office Action issued in JP 2008-198625 on May 26, 2010.
Amendment filed in JP 2008-198625 on Jun. 28, 2010.
English Translation of Amendment filed in JP 2008-198625 on Jun. 28, 2010.
English Language Abstract of JP 2006-313717 published Nov. 16, 2006.
Machine English Translation of JP 2006-313717 published Nov. 16, 2006.
English Language Abstract of JP 2009-135026 published Jun. 18, 2009.
English Language Translation of JP 2009-135026 published Jun. 18, 2009.
English Language Abstract of JP 2002-525814 published Aug. 13, 2002.
English Language Translation of JP 2002-525814 published Aug. 13, 2002.
English Language Abstract of JP 2003-059305 published Feb. 28, 2003.
English Language Translation of JP 2003-059305 published Feb. 28, 2003.
English Language Abstract of JP 2007-188832 published Jul. 26. 2007.
English Language Translation of JP 2007-188832 published Jul. 26. 2007.
English Language Abstract of JP 2008-027910 published Feb. 7, 2008.
English Language Translation of JP 2008-027910 published Feb. 7, 2010.
English Language Abstract of JP 2007-207576 published Aug. 16, 2007.
English Language Translation of JP 2007-207576 published Aug. 16, 2007.
English Language Abstract of JP 2007-073306 published Mar. 22, 2007.
English Language Translation of JP 2007-073306 published Mar. 22, 2007.
U.S. Appl. No. 12/845,330 as of Apr. 15, 2011.
U.S. Appl. No. 12/885,005 as of Apr. 15, 2011.
U.S. Appl. No. 12/933,969 as of Apr. 15, 2011.
U.S. Appl. No. 12/885,849 as of Apr. 15, 2011.
U.S. Appl. No. 12/886,025 as of Apr. 15, 2011.
U.S. Appl. No. 12/886,123 as of Apr. 15, 2011.
U.S. Appl. No. 11/399,492 (now U.S. Patent 7,758,223) as of Apr. 15, 2011.
Extended European Search Report issued in EP Appl 10006720.6 on Oct. 13, 2010.
English Language Abstract of JP 61-35216 published Feb. 2, 1086.
IPRP & WO issued in PCT/JP2008/073436 on Aug. 10, 2010.
English Language Abstract of JP 2006-156187 published Jun. 15, 2006.
English Language Translation of JP 2006-156187 published Jun. 15, 2006.
U.S. Appl. No. 13/044,369 as of Apr. 15, 2011.
U.S. Appl. No. 12/888,921 as of Apr. 15, 2011.
U.S. Appl. No. 13/034,959 as of Apr. 15, 2011.

Extended European Search Report issued in EP 111560003.9 on May 18, 2011.
Extended European Search Report issued in EP 08838942.4 on Jun. 1, 2011.
English Language Abstract of JP 2008-277561 published on Nov. 13, 2008.
English Language Translation of JP 2008-277561 published on Nov. 13, 2008.
English Language Abstract of JP 2008-227412 published Sep. 25, 2008.
English Language Translation of JP 2008-227412 published Sep. 25, 2008.
U.S. Appl. No. 12/794,558 captured on Apr. 16, 2011 to Aug. 1, 2011.
U.S. Appl. No. 12/738,081 captured on Apr. 16, 2011 to Aug. 1, 2011.
U.S. Appl. No. 13/172,557 electronically captured on Aug. 1, 2011.
Japanese Office Action issued in 2005-269017 on Jan. 13, 2011.
English Language Translation of Japanese Office Action issued in 2005-269017 on Jan. 13, 2011.
English Language Abstract of JP 2004-221042 published Aug. 5, 2004.
English Language Translation of JP 2004-221042 published Aug. 5, 2004.
English Language Abstract of JP 63-102265 published May 7, 1988.
English Language Abstract of JP 2009-206104 published Sep. 10, 2009.
English Language Translation of JP 2009-206104 published Sep. 10, 2009.
European Search Report issued in EP 10178361.1 on Jul. 4, 2011.
U.S. Appl. No. 13/221,519 electronically captured on Oct. 21, 2011.
U.S. Appl. No. 13/221,551 electronically captured on Oct. 21, 2011.
U.S. Appl. No. 12/794,379 captured on Oct. 21, 2011.
U.S. Appl. No. 12/794,429 captured on Oct. 21, 2011.
U.S. Appl. No. 12/794,476 captured on Oct. 21, 2011.
U.S. Appl. No. 12/794,509 captured on Oct. 21, 2011.
U.S. Appl. No. 12/738,081 captured on Oct. 21, 2011.
U.S. Appl. No. 12/885,005 electronically captured on Oct. 21, 2011.
Chinese Office Action issued in ON2010102793033 on Jul. 10, 2012.
English Language Translation of Chinese Office Action issued in CN2010102793033 on Jul. 10, 2012.
English Language Abstract of JP 2005-217354 published Aug. 11, 2005.
English Language Translation of JP 2005-217354 published Aug. 11, 2005.
English Language Abstract of JP 2006-286461 published Oct. 19, 2006.
English Langugae Translation of JP 2006-286461 published Oct. 19, 2006.
English Language Abstract of WO 2009/085231 published Jul. 9, 2009.
English Language Abstract of CN 1644978 published Jul. 27, 2005.

* cited by examiner

LIGHT-EMITTING DEVICE AND ILLUMINATION DEVICE

CROSS-REFERENCE TO RELATED APPLICATIONS

This application is based upon and claims the benefit of priority from Japanese Patent Applications No. 2009-212502, filed Sep. 14, 2009; and No. 2010-172717, filed Jul. 30, 2010; the entire contents of both of which are incorporated herein by reference.

FIELD

Embodiments described herein relate generally to a light-emitting device using a light-emitting element, such as a light-emitting diode, and to an illumination device in which the light-emitting device is mounted.

BACKGROUND

The service life of a light-emitting element such as a light-emitting diode decreases as temperature increases. Accordingly, there is a demand for a light source incorporating a light-emitting diode to be able to efficiently extract and externally output light from the light-emitting diode while suppressing an increase in temperature of the light-emitting diode.

To meet the demand, there is a conventional light-emitting device using a white ceramic substrate as a substrate on which a light-emitting diode is mounted. The ceramic substrate is fixed to the body of the light-emitting device by a securing member such as a screw. The body is made of a metallic material having excellent thermal radiation performance, such as aluminum.

The ceramic substrate is characterized by being more fragile and more easily cracked than a metal substrate. Therefore, when the ceramic substrate is fixed to the body of the light-emitting device by screws, the ceramic substrate sometimes breaks.

Further, a difference in coefficient of thermal expansion between the ceramic substrate and the body inevitably causes stress to act on a portion of the ceramic substrate which is fixed to the body. As a result, the ceramic substrate is sometimes damaged during operation of the light-emitting device.

DETAILED DESCRIPTION

In general, according to one embodiment, a light-emitting device comprises a ceramic substrate, a plurality of light-emitting elements, and a pressure member. The substrate comprises a first surface in contact with a thermally radiative member, a second surface positioned on the opposite side to the first surface, and an outer circumferential surface bridging outer circumferential edges of the first and second surfaces. The light-emitting elements are mounted on the second surface. The pressure member elastically press the substrate toward the thermally radiative member. A gap is provided between the pressure member and the outer circumferential surface of the substrate.

A semiconductor light-emitting element such as a light-emitting diode can be used as the light-emitting element. The light-emitting element is desirably mounted on the substrate by the chip-on-board method. However, the method of mounting the light-emitting element on the substrate is not particularly limited. Further, the number of light-emitting elements is not particularly restricted.

The thermally radiative member may include a heat sink or the body, case, or cover of the light-emitting device. In other words, a thermally radiative member means an element having a thermal conductivity, which is thermally connected to the substrate. The pressure member is fixed directly or indirectly to the thermally radiative member, and elastically energizes the substrate toward the thermally radiative member. A pressure member as described above can be formed of metallic material, such as elastic stainless steel or phosphor bronze.

The substrate can be formed of a ceramic material, such as aluminum oxide, aluminum nitride, or silicon nitride. However, the material forming the substrate is not limited to a particular ceramic material.

First Embodiment

Hereinafter, the first embodiment will be described with reference to FIGS. 1 to 8.

Figure 1:
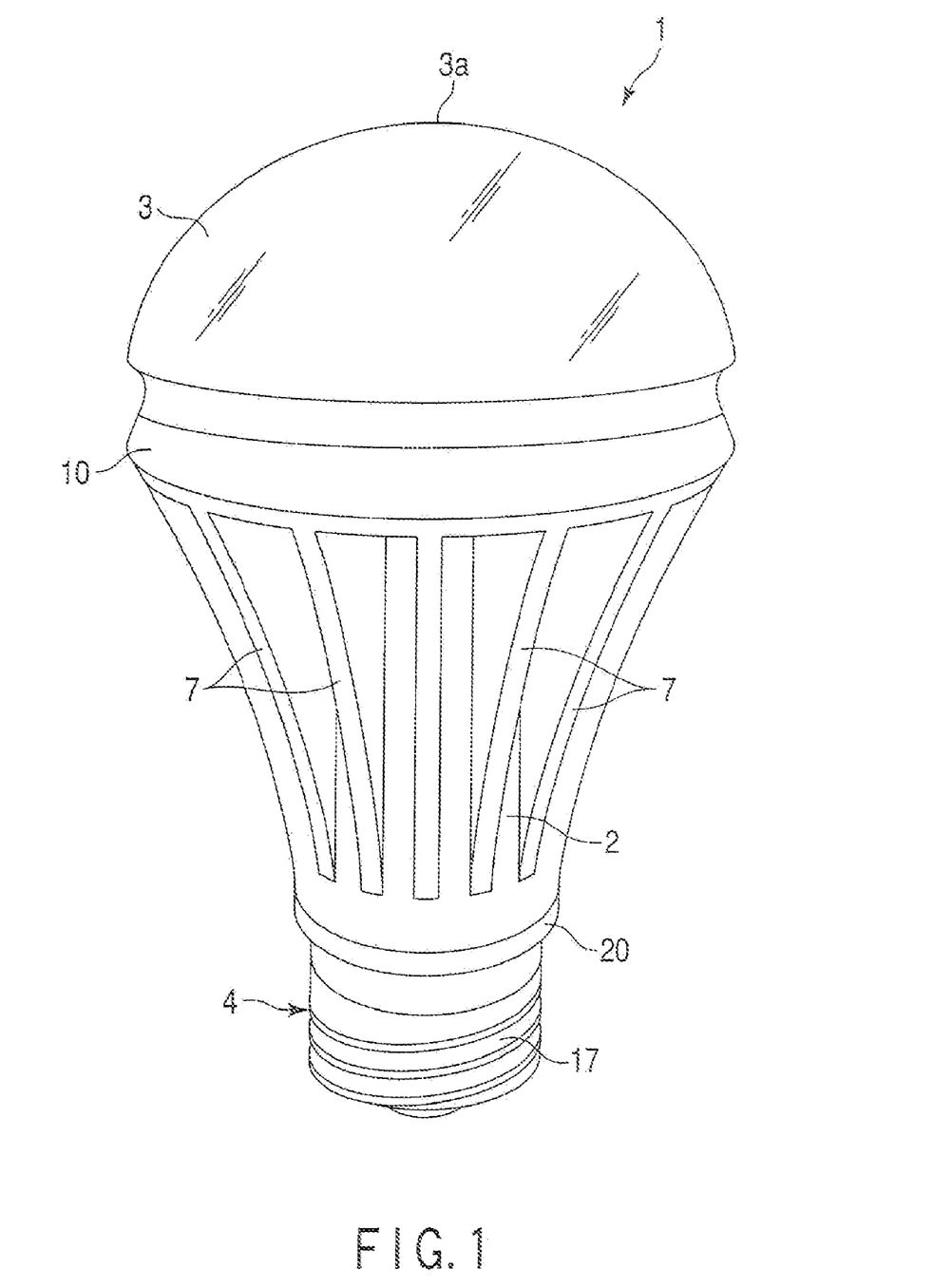
FIG. 1 is a perspective view of an LED lamp according to the first embodiment.
Figure 2:
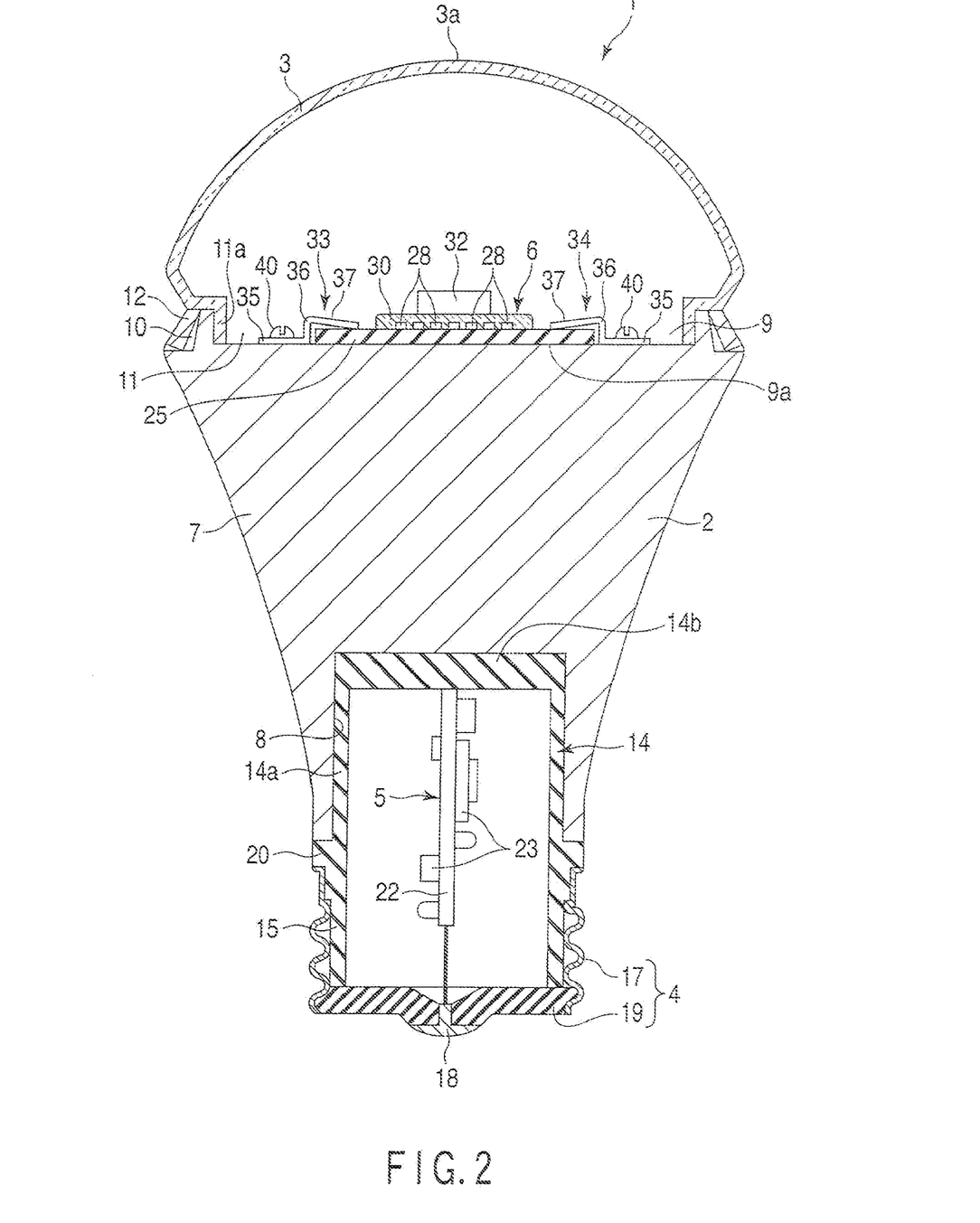
FIG. 2 is a cross-sectional view of the LED lamp according to the first embodiment.

FIGS. 1 and 2 illustrate a bulb-type LED lamp 1 as an example of an illumination device. The LED lamp 1 comprises a lamp body 2, a globe 3, an E-shaped base 4, a lighting device 5, and a chip-on-board (COB) light-emitting device 6.

The lamp body 2 is made of a metallic material having excellent thermal conductivity, such as aluminum, and also functions as a thermally radiative member. The lamp body 2 has a substantially round columnar shape. A plurality of thermally radiative fins 7 is formed to be integral with an outer circumferential surface of the lamp body 2. The thermally radiative fins 7 protrude from the outer circumferential surface of the lamp body 2, and taper outward radially from the lamp body 2 from one end of the body to the other. As a result, the lamp body 2 is formed to have a greater diameter at the other end thereof than at the one end thereof.

As shown in FIG. 2, the lamp body 2 comprises a first recess 8 and a second recess 9. The first recess 8 is located at one end of the lamp body 2, and extends toward the other end of the lamp body 2. The second recess 9 is located at the other end of the lamp body, 2, and extends toward the end of the lamp body 2 at which the first recess 8 is located. The second recess 9 has a bottom which is a flat support surface 9a. Further, an annular step part 10 is provided at the other end of the lamp body 2. The step part 10 surrounds the second recess 9 and is open to periphery of the lamp body 2.

The globe 3 is, for example, formed in a substantially semi-spherical shape from optically diffusive glass or a composite resin material. The globe 3 has a spherical top 3a and an opening 11 opposed to the top 3a. The opening 11 has a smaller diameter than a maximum diameter of the globe 3. An edge part 11a of the globe 3 which defines the opening 11 is protruded to a side opposite to the top 3a of the globe 3, and is engaged with the second recess 9 of the lamp body 2. As a result, the globe 3 is joined to the lamp body 2, and covers the support surface 9a of the second recess 9.

The step part 10 positioned at the other end of the lamp body 2 is adjacent to an outer circumferential part of such a part of the globe 3 that has a maximum diameter. A reflection ring 12 is attached to the step part 10. The reflection ring 12 connects an outer circumferential edge of the other end of the lamp body 2 with an outer circumferential part of the globe 3.

As illustrated in FIG. 2, a cover member 14 is attached to the first recess 8 of the lamp body 2. The cover member 14 may be made of an electrically insulative material, such as PET resin. The cover member 14 comprises a cylindrical circumferential wall 14a and an end wall 14b.

The circumferential wall 14a is engaged with the first recess 8 and covers an inner circumferential surface of the first recess 8. The circumferential wall 14a comprises a cylindrical protrusion 15 which protrudes out of the lamp body 2 from the first recess 8. The end wall 14b closes an opening end of the circumferential wall 14a, and covers a bottom of the first recess 8. Further, an internal space of the cover member 14 communicates with the support surface 9a of the lamp body 2 through a through hole 16 which penetrates the lamp body 2.

The base 4 is constituted by a metal shell 17 screwed into a lamp socket, and an insulator 19 including an eyelet terminal 18. The shell 17 is attached to the protrusion 15 so as to cover the protrusion 15 of the cover member 14 from outside. The insulator 19 collides with an opening end of the protrusion 15, and closes the internal space of the cover member 14.

The cover member 14 comprises a flange 20 which extends from an outer circumferential surface of the protrusion 15. The flange 20 is provided to continue in a circumferential direction of the protrusion 15. The flange 20 is provided between an open end of the shell 17 and the one end of the lamp body 2, and electrically insulates the base 4 and the lamp body 2 from each other.

The lighting device 5 is contained in the internal space of the cover member 14, and is electrically connected to the base 4. The lighting device 5 comprises a rectangular circuit board 22 and a plurality of such circuit components 23 as a transistor, resistor, constant voltage diode, full-wave rectifier, and capacitor mounted on the circuit board 22. The circuit board 22 is provided inside the cover member 14, oriented vertically along the axis of the lamp body 2.

The region bounded by the cover member 14 is not limited to being a space for merely containing the lighting device 5. For example, a filler which has thermally radiative characteristics and provides electrical insulation may be introduced into the space bounded by the cover member 14. A silicone-based resin material may be used as the filler. The filler is inserted between the lighting device 5 and the cover member 14 so as to cover the lighting device 5.

Figure 3:
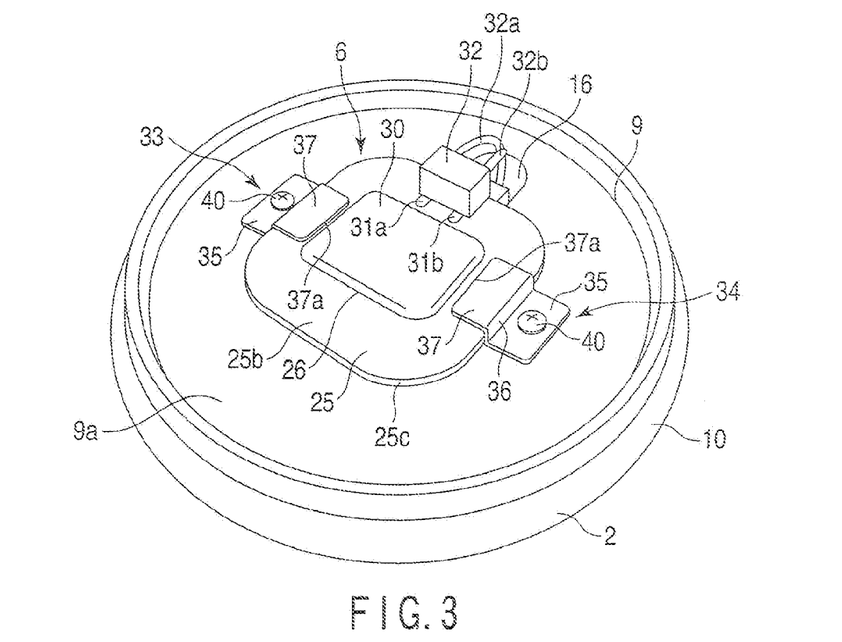
FIG. 3 is a perspective view illustrating a state where a light-emitting device is attached to a support surface of a lamp body in the first embodiment.
Figure 4:
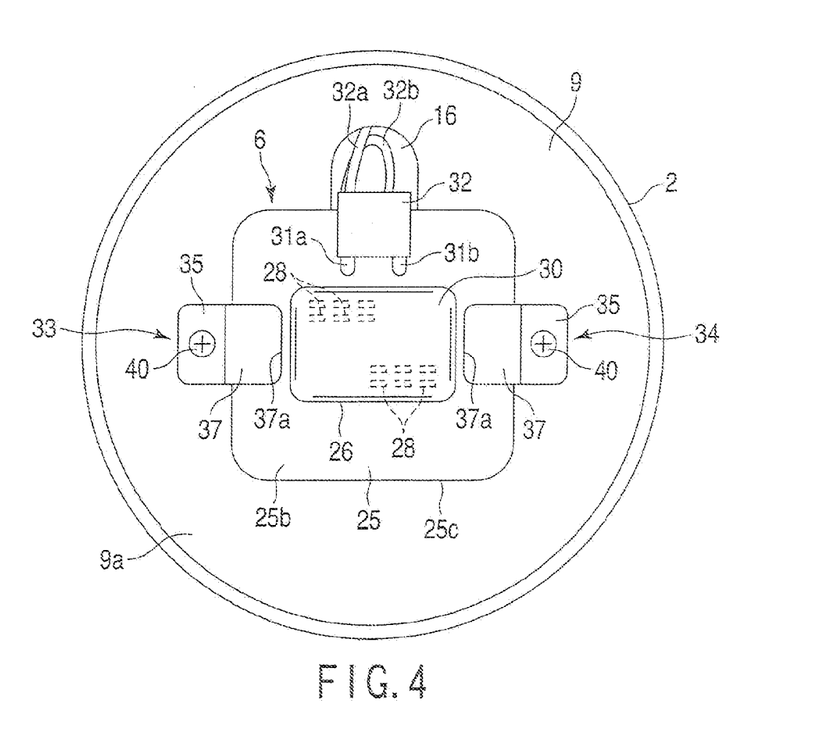
FIG. 4 is a plan view illustrating a state in which the light-emitting device is attached to the support surface of the lamp body in the first embodiment.

As illustrated in FIG. 2, the light-emitting device 6 is used as a light source for the LED lamp 1. The light-emitting device 6 is attached to the support surface 9a of the lamp body 2, and covers the globe 3. As illustrated in FIGS. 3 and 4, light-emitting device 6 comprises a rectangular substrate 25. The substrate 25 is made of, for example, a white ceramic material such as aluminum oxide or aluminum nitride, and is electrically insulative.

Figure 8:
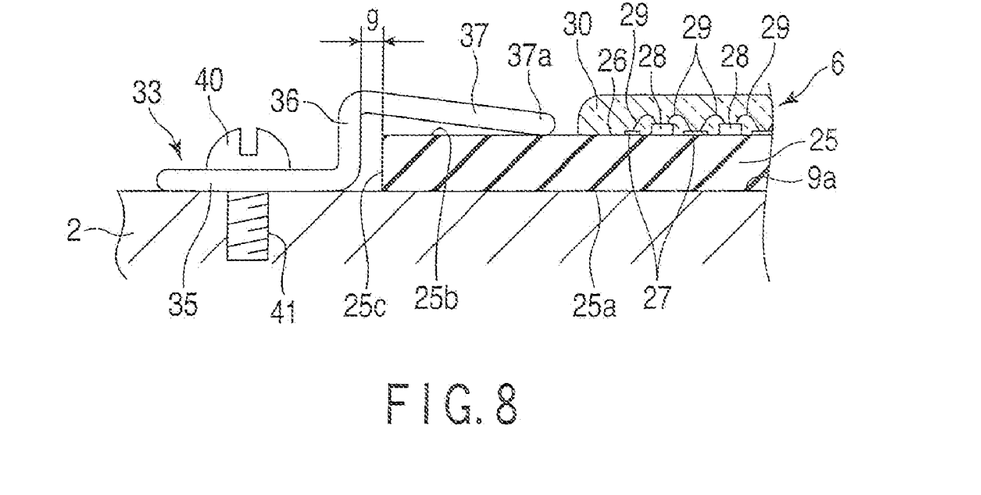
FIG. 8 is a cross-sectional view illustrating the positional relationship between a substrate and the pressure member in the light-emitting device according to the first embodiment.

As illustrated in FIGS. 3, 4, and 8, the substrate 25 has a first surface 25a, a second surface 25b, and an outer circumferential surface 25c. The first surface 25a is a flat surface facing the support surface 9a of the lamp body 2. The second surface 25b is positioned in a side opposite to the first surface 25a, and constitutes a flat mounting surface. The outer circumferential surface 25c bridges outer circumferential edges of the first surface 25a and second surface 25b, and extends in the thickness direction of the substrate 25.

The second surface 25b of the substrate 25 includes a rectangular mounting area 26 as illustrated in FIGS. 4 and 8. The mounting area 26 is positioned in the center of the second surface 25b. A plurality of wire patterns 27 are formed on the mounting area 26. The wire patterns 27 are arrayed in a matrix at intervals between each other.

A plurality of light-emitting diode chips 28 are provided on the mounting area 26. The first embodiment uses about 100 light-emitting diode chips 28. The light-emitting diode chips 28 are each bonded to the mounting area 26 with a silicone-based adhesive agent, and are regularly arranged to be adjacent to the wire patterns 27, respectively.

The first embodiment uses, for example, InGaN light-emitting elements as the light-emitting diode chips 28. The light-emitting diode chips 28 each comprise a translucent sapphire board, and a light-emitting layer which is layered on the sapphire board and emits blue light. The light-emitting layer is constituted by layering an N-type nitride semiconductor layer, an InGaN light-emitting layer, and a P-type nitride semiconductor layer on one another.

Further, the light-emitting diode chips 28 each comprise positive and negative electrodes which supply the light-emitting layer with an electric current. The positive electrode comprises a P-type electrode pad formed on the P-type nitride semiconductor layer. The negative electrode comprises an N-type electrode pad formed on the N-type nitride semiconductor layer.

The positive and negative electrodes each are electrically connected to an adjacent one of the wire patterns 27 through a bonding wire 29. The first embodiment uses a gold wire as the bonding wire 29. In addition, to improve mounting rigidity of the bonding wire 29 and to reduce damages on the light-emitting diode chips 28, the bonding wires 29 are connected to the positive and negative electrodes and the wire patterns 27 through bumps containing Au as a main component, respectively.

The wire patterns 27 and light-emitting diode chips 28 are covered with a sealing material 30. The sealing material 30 is made of, for example, a transparent or translucent resin material having optical permeability, such as epoxy resin or silicone resin. The sealing material 30 contains a fluorescent substance. As the fluorescent substance, a yellow fluorescent substance which emits yellow light when excited by blue light emitted by the light-emitting diode chips 28 is used.

As illustrated in FIG. 3, a pair of power supply terminals 31a and 31b are provided on the second surface 25b of the substrate 25. The power supply terminals 31a and 31b are provided at positions apart from the mounting area 26, and are electrically connected to the wire patterns 27. Further, a connector 32 is soldered to the power supply terminals 31a and 31b. The connector 32 is electrically connected to the lighting device 5 through covered, cables 32a and 32b which are inserted in the through hole 16.

As illustrated in FIGS. 3 and 4, a pair of pressure members 33 and 34 is attached to the support surface 9a of the lamp body 2. The pressure members 33 and 34 elastically support the light-emitting device 6 on the support surface 9a of the lamp body 2, at two portions with the mounting area 26 of the substrate 25 positioned therebetween. The pressure members 33 and 34 have a configuration common to each other, and therefore, only pressure member 33 will be described as a representative.

Figure 5:
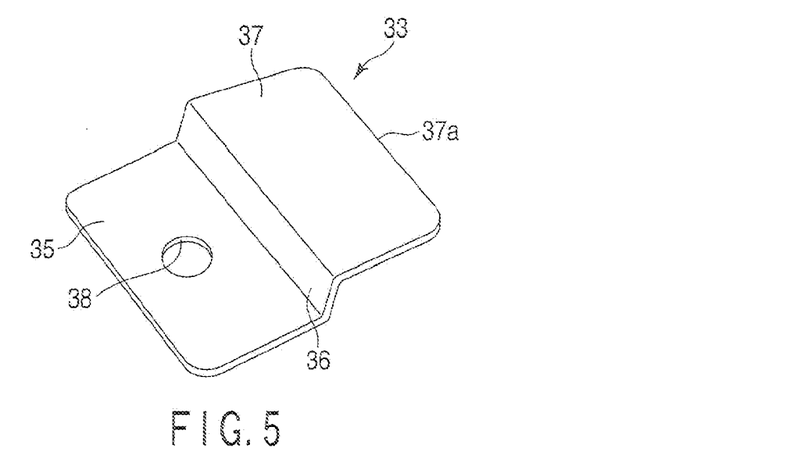
FIG. 5 is a perspective view of a pressure member used in the first embodiment.
Figure 6:
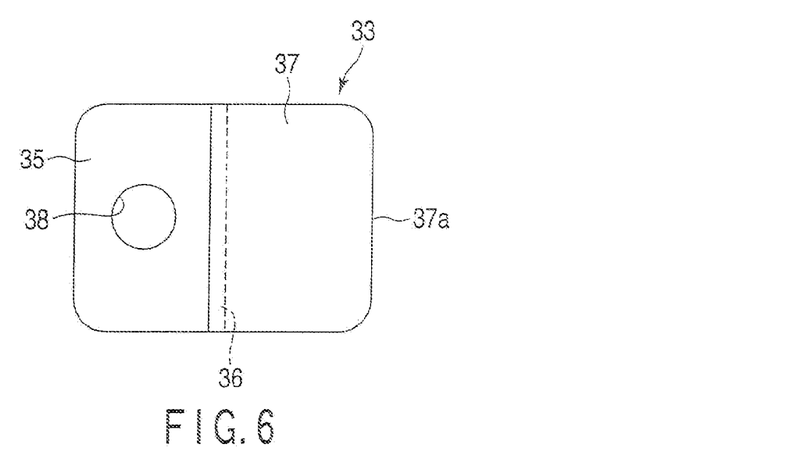
FIG. 6 is a plan view of the pressure member used in the first embodiment.
Figure 7:
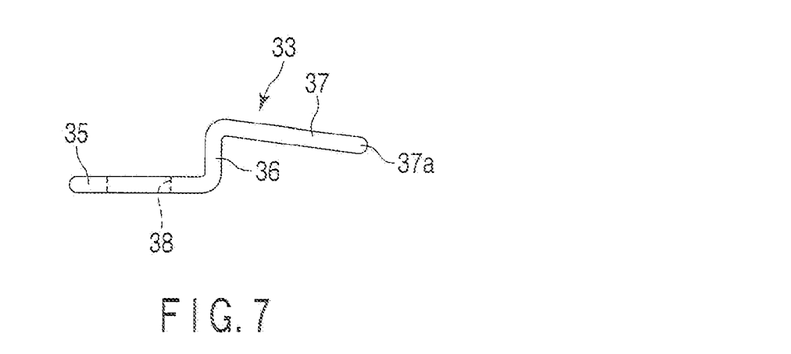
FIG. 7 is a side view of the pressure member used in the first embodiment.

The pressure member 33 is constituted by a plate spring which is formed, for example, by folding a stainless steel plate having a thickness of 0.3 mm into steps. More specifically, as illustrated in FIGS. 5 to 7, the pressure member 33 comprises a fixing part 35, a rising part 36, and a pressure part 37. The fixing part 35 has a flat rectangular shape, and has an insertion hole 38 at the center thereof. The rising part 36 substantially vertically rises from the edge of the fixing part 35. The rising part 36 has a greater height than the substrate 25. The pressure part 37 is a flat rectangular plate-like shape, and extends from a protruding end of the rising part 36 toward an opposite side to the fixing part 35. Further, the pressure part 37 is inclined downwards from the rising part 36 and is elastically deformable about the protruding end of the rising part 36 as a fulcrum.

As FIG. 8 illustrates most appropriately, the fixing part 35 of the pressure member 33 is fixed to the support surface 9a of the lamp body 2 by a screw 40. The screw 40 penetrates the insertion hole 38 of the fixing part 35 and is driven into a screw hole 41 provided in the support surface 9a. As a result, the rising part 36 of the pressure member 33 faces the outer circumferential surface 25c of the substrate 25, and the pressure part 37 of the pressure member 33 extends over an outer peripheral part of the second surface 25b of the substrate 25.

When the pressure member 33 is fixed to the support surface 9a, a top end 37a of the pressure part 37 makes elastic contact with the second surface 25b of the substrate 25. In other words, the pressure part 37 applies a load to the substrate 25, which elastically presses the first surface 25a of the substrate 25 toward the support surface 9a. In this way, the first surface 25a of the substrate 25 is pressed against the support surface 9a, and the light-emitting device 6 is elastically maintained on the lamp body 2. In addition, the substrate 25 of the light-emitting device 6 is thermally connected to the support surface 9a of the lamp body 2.

In the first embodiment, thermally conductive grease is desirably introduced between the first surface 25a of the substrate 25 and the support surface 9a of the lamp body 2, to ensure a more reliable thermal path between the substrate 25 and the lamp body 2.

Further, according to the first embodiment, the rising part 36 bridging the fixing part 35 and the pressure part 37 is apart from the outer circumferential surface 25c of the substrate 25 when the pressure member 33 is fixed to the support surface 9a. In other words, a gap of, for example, about 0.5 mm is created between the rising part 36 of the pressure member 33 and the outer circumferential surface 25c of the substrate 25. The gap g functions as, namely, a play which allows the pressure member 33 fixed to the support surface 9a and the substrate 25 to move relatively to each other.

In the LED lamp 1 as described above, a voltage is applied to the light-emitting device 6 through the lighting device 5. As a result, all the light-emitting diode chips 28 on the substrate 25 emit light at once. The blue light emitted by the light-emitting diode chips 28 is incident on the sealing material 30. A part of the blue light incident on the sealing material 30 is absorbed by the yellow fluorescent substance. The remaining blue light is not absorbed by the yellow fluorescent substance but penetrates the sealing material 30.

The yellow fluorescent substance which has absorbed the blue light is excited and emits yellow light. The yellow light penetrates the sealing material 30. As a result, the yellow light and the blue light are mixed with each other into white light inside the sealing material 30. The white light is radiated toward the globe 3 from the sealing material 30, and penetrates the globe 3 for an illumination purpose. Light which penetrates the part of the globe 3 having the maximum diameter toward the lamp body 2 is reflected by the reflection ring 12 and is guided in a direction in which the light is to be output.

When the light-emitting diode chips 28 emit light, heat produced by the light-emitting diode chips 28 is conducted from the substrate 25 to the support surface 9a of the lamp body 2. Heat conducted to the lamp body 2 is radiated outside the LED lamp 1 through the thermally radiative fins 7.

As a result, the thermal radiation performance of the light-emitting diode chips 28 improves, and overheating of the light-emitting diode chips 28 is suppressed. Accordingly, light-emitting efficiency can be excellently maintained.

According to the first embodiment, the ceramic substrate 25, lamp body 2, and pressure members 33 and 34 are heated by heat produced by the light-emitting diode chips 28. Then, stress which acts on the substrate 25 supported on the support surface 9a can be produced in the thickness direction of the substrate 25 and along the support surface 9a since there appear differences in coefficient of thermal expansion between the substrate 25, lamp body 2, and pressure members 33 and 34.

That is, the pressure parts 37 of the pressure members 33 and 34 which press the substrate 25 against the support surface 9a are elastically deformable in the thickness direction of the substrate 25. Therefore, the stress along the thickness direction of the substrate 25 can be absorbed by elasticity of the pressure parts 37.

In addition, the rising parts 36 of the pressure members 33 and 34 are apart from the outer circumferential surface 25c of the substrate 25, and the gap g is maintained between the rising part 36 and the outer circumferential surface 25c of the substrate 25. As a result, even when the stress in the direction along the support surface 9a occurs, the stress can be absorbed by the presence of the gap g. That is, the gap g allows play to absorb the stress acting on the substrate 25.

Accordingly, the drawback of cracking of the ceramic substrate 25 during operation of the LED lamp 1 can be prevented.

The inventor conducted a test for investigating the thermal resistance ratio between the substrate 25 and the support surface 9a, and the rate at which the substrate 25 cracks when the load applied to the substrate 25 by the pressure members 33 and 34 is changed.

This test involved a ceramic substrate containing 96% alumina, and stainless steel pressure members 33 and 34. After 40,000 hours of operation, the ratio of change of elasticity of the stainless steel was 88% with the pressure members 33 and 34 at a temperature of 90° C., 84% at 120° C., and 78% at 150° C.

The test was conducted on an LED lamp according to the prior art in which a substrate was perfectly fixed to a support surface by screws, and on an LED lamp according to test samples 1 to 5, below, in which substrates were elastically supported on support surfaces. For test sample 1, the load elastically applied to the substrate was 150 g; for test sample 2, 200 g; for test sample 3, 250 g; for test sample 4, 300 g; and for test sample 5, 350 g.

Table 1, below, shows the results of investigating the thermal resistance ratio and the rate at which the substrate cracks in each of the prior art and test samples 1 to 5. In test samples 1 to 5, the thermal resistance ratios were evaluated relative to the thermal resistance ratio of the prior art sample as 100%.

TABLE 1

|  | Prior Art | Test Sample 1 | Test Sample 2 | Test Sample 3 | Test Sample 4 | Test Sample 5 |
|---|---|---|---|---|---|---|
| Support method | Screw | Elastic support | Elastic support | Elastic support | Elastic support | Elastic support |
| Load (g) | Perfectly fixed | 150 | 200 | 250 | 300 | 350 |
| Thermal resistance ratio (%) | 100 | 140 | 120 | 110 | 100 | 90 |
| Cracking probability (%) | 20 | 0 | 0 | 0 | 0 | 10 |

As can be seen from Table 1, the probability of the substrate cracking was 20% for the prior art sample. In contrast, for test samples 1 to 5, the thermal resistance ratio decreased as the load applied to the substrate increased. Thermal conduction from the substrate to the lamp body was found to be excellent. However, when the load applied to the substrate reached 350 g, the probability of the substrate cracking was found to be 10%.

Accordingly, from the results shown in Table 1, it can be concluded that the load applied to the substrate is desirably set to 200 to 300 g to achieve excellent thermal conduction from the substrate to the lamp body. Furthermore, with such a load, cracking of the substrate can be eliminated. Thus, the substrate can be relied on to remain stable on the support surface of the lamp body.

In addition, even after the LED lamp has operated for 40,000 hours, 85% of the load applied to the substrate by the pressure members is maintained insofar as the temperature of the pressure members does not exceed 120° C. Thus, the load applied to the substrate by the pressure members has been confirmed to be small.

Second Embodiment

Figure 9:
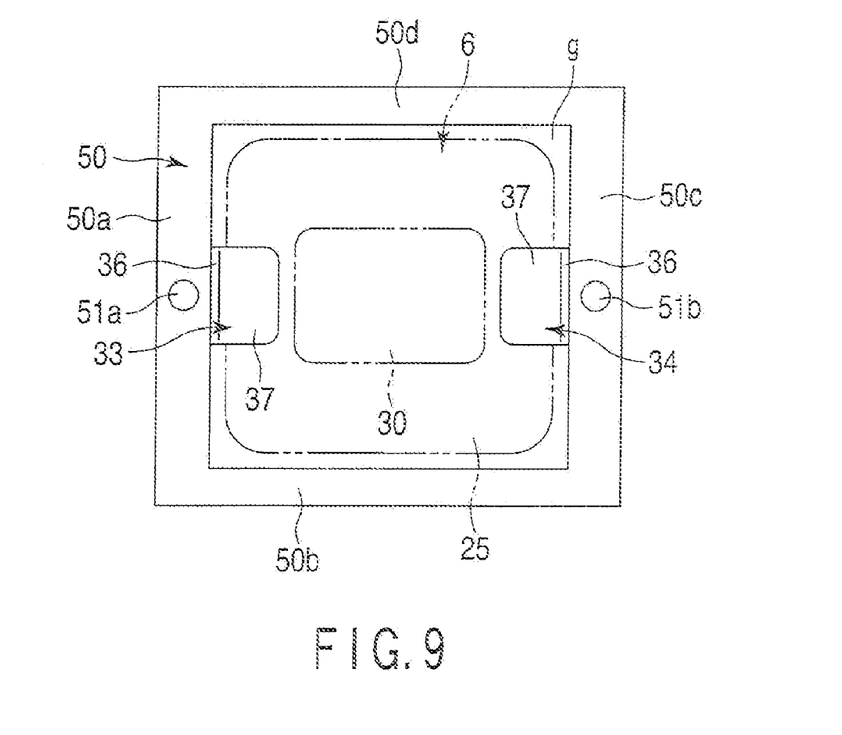
FIG. 9 is a plan view of a pressure member used in the second embodiment.

FIG. 9 illustrates the second embodiment.

The second embodiment differs from the first in a configuration of pressure members 33 and 34 which apply a load to a substrate of a light-emitting device. The configuration of the second embodiment is the same as the first except for the pressure members 33 and 34.

According to the second embodiment, the pressure members 33 and 34 each comprise a fixing part 50 as a common constitutive element. The fixing part 50 is a rectangular frame and comprises first, second, third, and fourth edges 50a, 50b, 50c, and 50. The first, edge 50a and third edge 50c are arranged parallel to each other with an interval therebetween. Similarly, the second edge 50b and fourth edge 50d are arranged parallel to each other with an interval therebetween.

Therefore, the fixing part 50 is placed on a support surface 9a of a lamp body 2 in such a manner that the first, second, third, and fourth edges 50a, 50b, 50c, and 50d surround a substrate 25 of the light-emitting device 6.

A rising part 36 and a pressure part 37 of one pressure member 33 are formed to be integral with the first edge 50a. The pressure part 37 extends from the center of the first edge 50a toward the third edge 50c. The first edge 50a comprises an insertion hole 51a at a position corresponding to the one pressure member 33.

A rising part 36 and a pressure part 37 of the other pressure member 34 are formed to be integral with the third edge 50c. The pressure part 37 extends from the center of the third edge 50c toward the first edge 50a. The third edge 50c comprises an insertion hole 51b at a position corresponding to the other pressure member 34.

The fixing part 50 is fixed to the support surface 9a by driving screws into the support surface 9a through the insertion hole 51a and 51b. When the fixing part 50 is fixed to the support surface 9a, a gap is created between the first, second, third, and fourth edges 50a, 50b, 50c, and 50d of the fixing part 50 and an outer circumferential surface 25c of the substrate 25.

According to the second embodiment, a pair of pressure members 33 and 34 is connected to each other by the fixing part 50. Therefore, the pair of pressure members 33 and 34 can be simultaneously attached to the support surface 9a of the lamp body 2. Accordingly, assembly work is facilitated. In addition, the pair of pressure members 33 and 34 form an integral structure, and therefore, management of components can be simplified.

Third Embodiment

Figure 10:
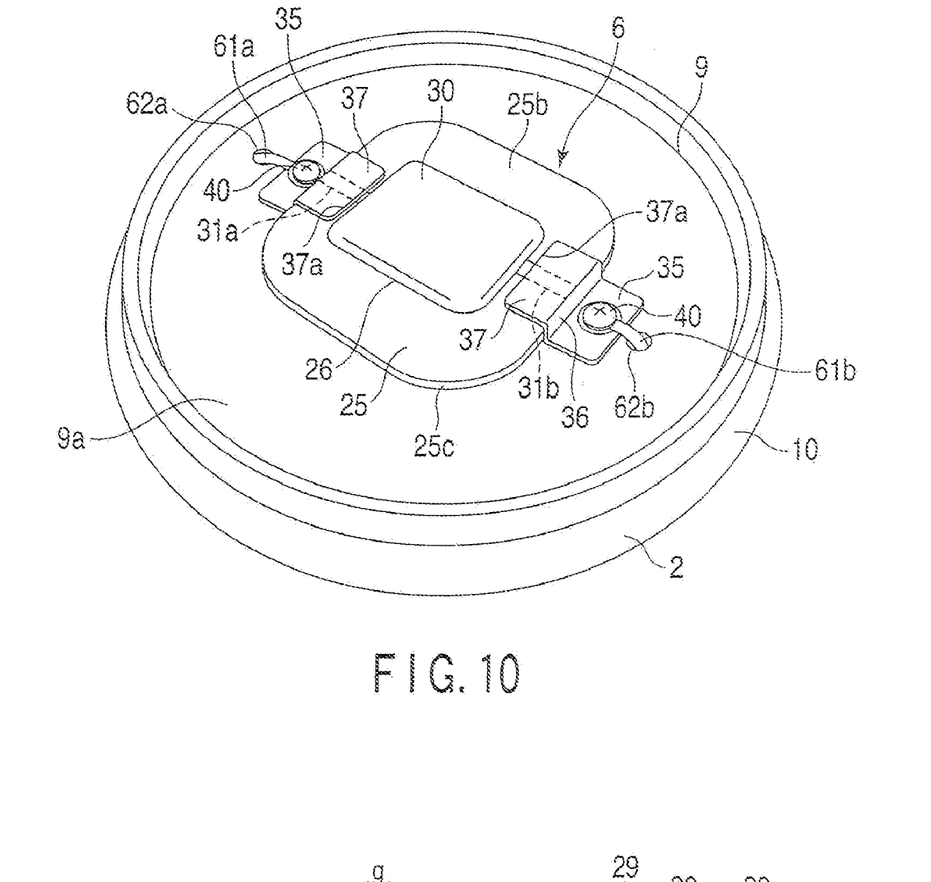
FIG. 10 is a perspective view illustrating a state in which a light-emitting device is attached to a support surface of a lamp body in the third embodiment.
Figure 11:
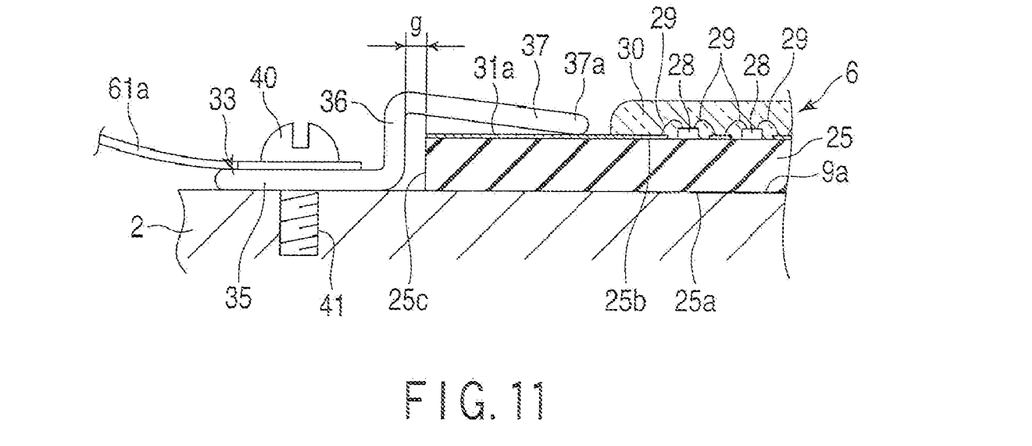
FIG. 11 is a cross-sectional view illustrating the positional relationship between a substrate and a pressure member in the light-emitting device according to the third embodiment.

FIGS. 10 and 11 illustrate the third embodiment.

The third embodiment differs from the first in that pressure members 33 and 34 also function as a connector for electrical conduction. A lamp body 2 and a light-emitting device 6 have the same basic configuration as in the first embodiment. Therefore, parts of the third embodiment that are the same as those of the first are denoted by the same reference symbols, and descriptions thereof are omitted.

As illustrated in FIG. 10, a pair of power supply terminals 31a and 31b is provided on the second surface 25b of the substrate 25 so as to interpose a mounting area 26 between the terminals. In other words, the power supply terminals 31a and 31b are exposed over the second surface 25b of the substrate 25 at positions corresponding to pressure parts 37 of the pressure members 33 and 34. The power supply terminals 31a and 31b are desirably covered with a metal plating layer.

In the second embodiment, top edges 37a of the pressure parts 37 make elastic contact with the power supply terminals 31a and 31b. Therefore, the pressure members 33 and 34 apply a load which elastically presses a first surface 25a of the substrate 25 toward a support surface 9a from the power supply terminals 31a and 31b.

Further, a pair of leads 61a and 61b are connected to fixing parts 35 of the pressure members 33 and 34 by screws 40. The leads 61a and 61b are guided into a base through a pair of through holes 62a and 62b opened in the support surface 9a of the lamp body 2, and are electrically connected to a lighting device.

As a material for the pressure members 33 and 34, for example, phosphor bronze copper which has higher electrical conductivity than stainless steel is used, and a surface of the phosphor bronze copper is desirably covered with a metal plating layer, like the power supply terminals 31a and 31b. For example, if surfaces of the power supply terminals 31a and 31b are plated with silver, surfaces of phosphor bronze copper forming the pressure members 33 and 34 may also be plated with silver as well.

In the third embodiment, the inventor inspected contact states between the pressure parts 37 of the pressure members 33 and 34 and the power supply terminals 31a and 31b while changing the load applied to the power supply terminals 31a and 31b by the pressure members 33 and 34. Specifically, the load applied to the power supply terminals 31a and 31b by the pressure parts 37 was incremented from 50 to 200 g. When the load was 50, 70, 100, 150, and 200 g, an investigation was made on contact states between the pressure parts 37 and the power supply terminals 31a and 31b.

As a result, when the load applied to the power supply terminals 31a and 31b by the pressure members 33 and 34 was 50 g, an oxide film covering the power supply terminals 31a and 31b could not be removed by the pressure parts 37, and a contact error was found to occur. A reason is considered to be that a contact pressure of the pressure parts 37 against the power supply terminals 31a and 31b was short.

Accordingly, the load applied to the power supply terminals 31a and 31b by the pressure parts 37 was concluded to be desirably set to 70 to 200 g in order to appropriately maintain a contact state between the pressure parts 37 of the pressure members 33 and 34 and the power supply terminals 31a and 31b.

Further, when the light-emitting device 6 is used, for example, as an illumination device for roadways or as a light source for vehicles which is easily vibrated, the load applied to the power supply terminals 31a and 31b by the pressure parts 37 is desirably 200 to 300 g.

In this way, the contact pressure between the pressure parts 37 and the power supply terminals 31a and 31b can be sufficiently ensured to counteract vibration applied to the light-emitting device 6.

Therefore, the substrate 25 can be securely held on the support surface 9a of the lamp body 2 while adding a function as a contact point to the pressure members 33 and 34.

In addition, according to the third embodiment, a dedicated connector to be soldered to the power supply terminals 31a and 31b is not required. As a result, the light-emitting device 6 is not thermally influenced by the heat of soldering and can be operated at a junction temperature sustainable by the light-emitting diode chips 28.

Fourth Embodiment

Figure 12:
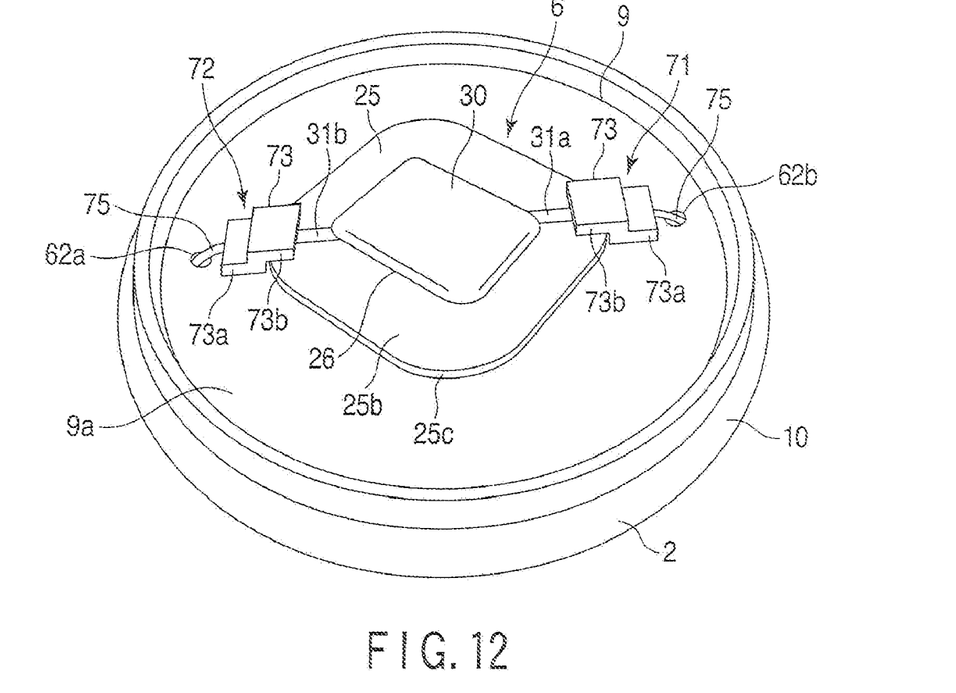
FIG. 12 is a perspective view illustrating a state in which a light-emitting device is attached to a support surface of a lamp body in the fourth embodiment.
Figure 13:
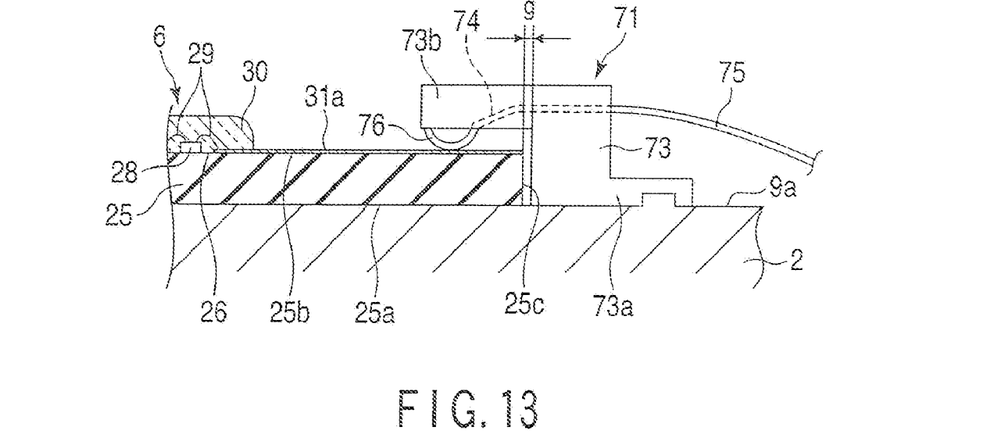
FIG. 13 is a cross-sectional view illustrating the positional relationship between a substrate and a pressure member in the light-emitting device according to the fourth embodiment.

FIGS. 12 and 13 illustrate the fourth embodiment.

The fourth embodiment differs from the third in that a substrate 25 of a light-emitting device 6 is configured to be held on a support surface 9a of a lamp body 2. The lamp body 2 and light-emitting device 6 have the same basic configuration as in the first embodiment. Therefore, parts of the fourth embodiment that are the same as those of the third are denoted by the same reference symbols, and descriptions thereof are omitted.

As illustrated in FIG. 12, a pair of power supply terminals 31a and 31b is guided from a mounting area 26 of a substrate 25 so as to be positioned on a diagonal line of the substrate 25. In other words, the power supply terminals 31a and 31b extend from the mounting area 26 on the substrate 25 in respectively opposite directions toward two corners of the substrate 25 which face each other.

A pair of pressure members 71 and 72 is attached to the support surface 9a of the lamp body 2. The pressure members 71 and 72 elastically support the light-emitting device 6 on the support surface 9 of the lamp body 2, at positions corresponding to the power supply terminals 31a and 31b. The pressure members 71 and 72 have a configuration common to each other, and therefore, only the pressure member 71 will be described as a representative.

As illustrated in FIG. 13, the pressure member 71 comprises a holder 73 made of synthetic resin, and a contact element 74 supported inside the holder 73. The holder 73 comprises a fixing part 73a fixed to the support surface 9a of the lamp body 2, and an extension part 73b which extends over a corner of the substrate 25 from a top end of the fixing part 73a. The extension part 73b faces the second surface 25b of the substrate 25 and the power supply terminal 31a.

The contact element 74 is formed of, for example, phosphor bronze copper or a Corson alloy. The contact element 74 is electrically connected to the lighting device through a lead 75. Further, the contact element 74 comprises an elastically deformable top end 76. The top end 76 overhangs from the extension 73b of the holder 73 toward the substrate 25 and makes elastic contact with the power supply terminal 31a.

Therefore, the contact element 74 applies a load which elastically presses a first surface 25a of the substrate 25 toward the support surface 9a from the power supply terminal 31a. In this way, the light-emitting device 6 is elastically held by the lamp body 2, and the contact element 74 is electrically connected to the power supply terminal 31a.

Further, when the light-emitting device 6 is fixed to the support surface 9a by the pressure member 71, the fixing part 73a of the holder 73 is apart from an outer circumferential surface 25c of the substrate 25. Therefore, a gap g is maintained between the fixing part 73a and the outer circumferential surface 25c of the substrate 25.

In the fourth embodiment, the load applied to the power supply terminal 31a by the contact element 74 is desirably set to 70 to 200 g as in the third embodiment. In addition, in a type of illumination device in which vibration is applied to a contact part between the contact element 74 and the power supply terminal 31a, the load applied to the power supply terminal 31a by the contact element 74 may be set to 200 to 300 g. According to the configuration described above, the substrate 25 can be securely held on the support surface 9a of the lamp body 2, while the contact element 74 of the pressure member 71 is added with a function as a contact point.

According to the fourth embodiment, the power supply terminals 31a and 31b extend respectively to a pair of corners facing each other, from the mounting area 26 at the center of the substrate 25. In other words, the power supply terminals 31a and 31b are positioned on a diagonal line of the substrate 25 with the mounting area 26 interposed between terminals. Therefore, an insulating distance can be sufficiently maintained between the power supply terminals 31a and 31b. Therefore, migration can be prevented from occurring, and deterioration of insulation of the substrate 25 can be avoided.

Fifth Embodiment

Figure 14:
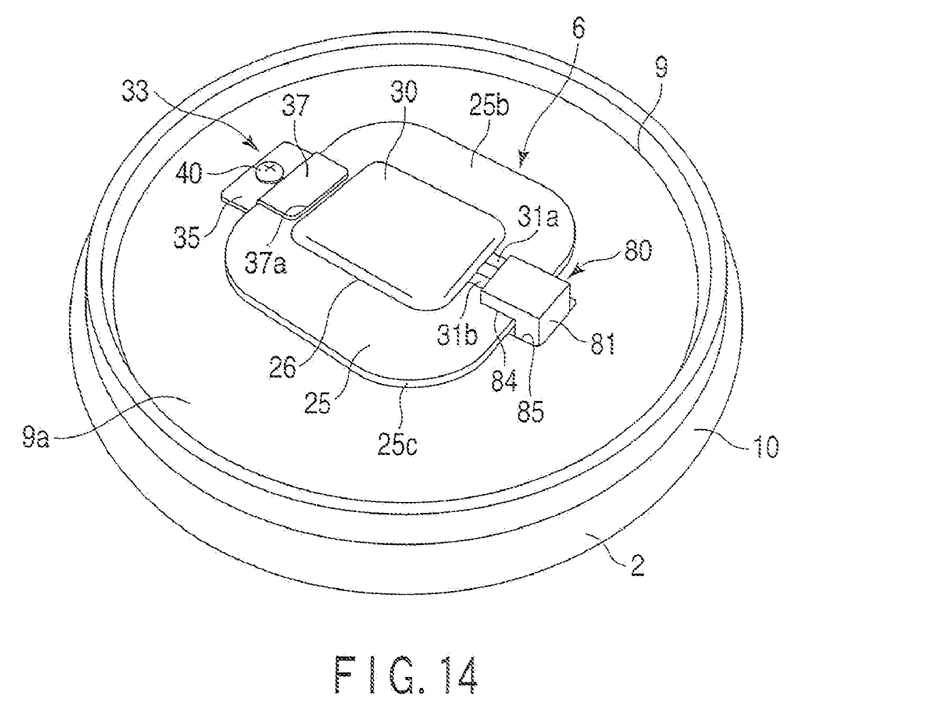
FIG. 14 is a perspective view illustrating a state in which a light-emitting device is attached to a support surface of a lamp body in the fifth embodiment.
Figure 15:
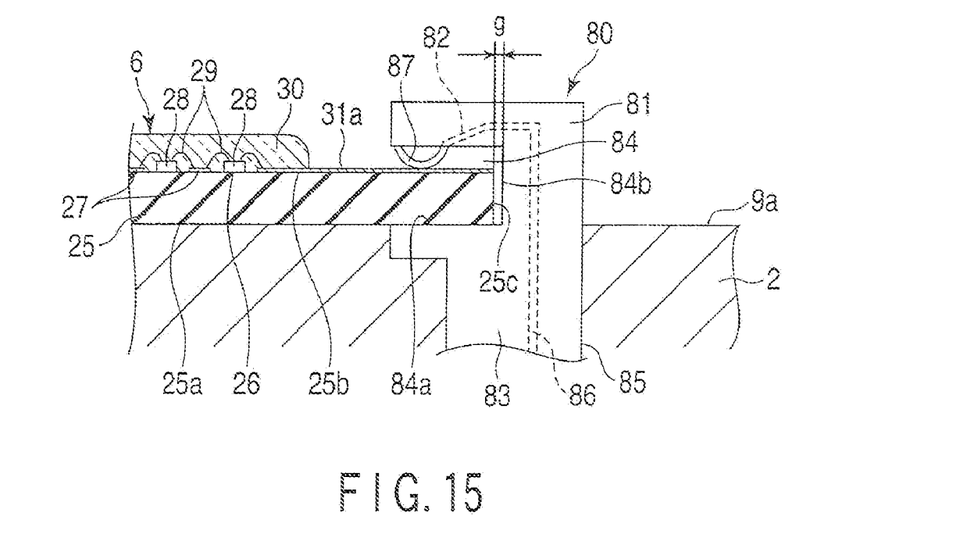
FIG. 15 is a cross-sectional view illustrating the positional relationship between a substrate and a pressure member in the light-emitting device according to the fifth embodiment.

FIGS. 14 and 15 illustrate the fifth embodiment.

In the fifth embodiment, a light-emitting device 6 is held on a support surface 9a of a lamp body 2 by a pressure member 33 and a connector member 80. The lamp body 2, light-emitting device 6, and pressure member 33 have the same basic configuration as in the first embodiment. Therefore, parts of the fifth embodiment that are the same as those of the first are denoted by the same reference symbols, and descriptions thereof are omitted.

As illustrated in FIG. 14, a pair of power supply terminals 31a and 31b is guided from a mounting area 26 at the center of a substrate 25 toward a side opposite to the pressure member 33. Therefore, the power supply terminals 31a and 31b are arranged parallel to each other to be guided from an outer circumferential part of a second surface 25b of the substrate 25.

The connector member 80 is attached to the substrate 25 at a position corresponding to the power supply terminals 31a and 31b. As illustrated in FIG. 15, the connector member 80 comprises a holder 81 made of synthetic resin, and a pair of contact elements 82 (only one of which is illustrated) supported on the holder 81.

The holder 81 comprises a leg part 83 and a recess 84. The leg part 83 is engaged with an engagement aperture 85 from above the support surface 9a, the engagement aperture being opened in the support surface 9a. The recess 84 is formed in a peripheral surface of the holder 81 to accept an outer circumferential part of the substrate 25.

Each of the contact elements 82 is formed of, for example, phosphor bronze copper or a Corson alloy. The contact elements 82 are arranged parallel to each other with an interval therebetween, and are electrically connected to a lighting device through leads 86, respectively. Each of the contact elements 82 comprises an elastically deformable top end 87. The top end 87 hangs to inside of the recess 84 and faces a bottom surface 84a of the recess 84.

The connector member 80 is held on a light-emitting device 6 by inserting the outer circumferential part of the substrate 25 into the recess 84 of the holder 81. When the outer circumferential part of the substrate 25 is inserted into the recess 84, top ends 87 of the contact elements 82 make elastic contact with the power supply terminals 31a and 31b. As a result, the contact elements 82 are electrically connected to the power supply terminals 31a and 31b. Accordingly, an outer circumferential part of a first surface 25a of the substrate 25 is pressed against the bottom surface 84a of the recess 84, and the substrate 25 is held by the connector member 80.

When the substrate 25 is held by the connector member 80, an inner circumferential surface 84b of the recess 84 is apart from an outer circumferential surface 25c of the substrate 25. Therefore, a gap g is maintained between the inner circumferential surface 84b of the recess 84 and the outer circumferential surface 25c of the substrate 25.

The connector member 80 integrated with the substrate 25 is set on the support surface 9a by engaging the leg part 83 with the engagement aperture 85 of the lamp body 2. In this state, a fixing part 35 of the pressure member 33 is fixed to the support surface 9a by a screw 40.

As a result, a top edge 37a of the pressure part 37 makes elastic contact with the second surface 25b of the substrate 25. The pressure part 37 applies a load to the substrate 25, which elastically presses the first surface 25a of the substrate 25 toward the support surface 9a. In this way, the first surface 25a of the substrate 25 is pressed against the support surface 9a, and the light-emitting device 6 and the connector member 80 are elastically maintained on the lamp body 2.

In the fifth embodiment, the load which the pressure member 33 applies to the substrate 25 is desirably set to 200 to 300 g as in the first embodiment. Further, the load applied to the power supply terminal 31a by the contact elements 82 of the connector member 80 is desirably set to 70 to 200 g as in the third embodiment. In addition, in a type of illumination device in which vibration is applied to a contact part between the contact elements 82 and the power supply terminal 31a, the load applied to the power supply terminal 31a by the contact elements 82 may be set to 200 to 300 g.

According to the fifth embodiment, the contact elements 82 of the connector member 80 can be stably put in contact with the power supply terminal 31a. Further, the substrate 25 of the light-emitting device 6 can be securely held on the support surface 9a of the lamp body 2.

While certain embodiments have been described, these embodiments have been presented by way of example only, and are not intended to limit the scope of the inventions. Indeed, the novel embodiments described herein may be embodied in a variety of other forms; furthermore various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A light-emitting device comprising:
a ceramic substrate which comprises a first surface in contact with a thermally radiative member, a second surface positioned in a side opposite to the first surface, and an outer circumferential surface which bridges outer circumferential edges of the first surface and the second surface;
a plurality of light-emitting elements mounted on the second surface of the substrate; and
a pressure member which elastically presses the substrate toward the thermally radiative member, with a gap provided between the pressure member and the outer circumferential surface of the substrate.

2. The light-emitting device of claim 1, wherein the pressure member applies a load to the substrate in a direction toward the thermally radiative member, and the load applied to the substrate is 200 to 300 g.

3. The light-emitting device of claim 1, further comprising a power supply terminal provided on the second surface of the substrate, wherein the pressure member makes elastic contact with the power supply terminal, thereby applying a load to the substrate toward the thermally radiative member, and the load applied to the substrate is 70 to 300 g.

4. An illumination device comprising:
a body comprising a thermally radiative member;
a light-emitting device supported on the body; and
a lighting device which is provided on the body and turns on the light-emitting device, wherein the light-emitting device comprises
- a ceramic substrate which comprises a first surface in contact with the body, a second surface positioned in a side opposite to the first surface, and an outer circumferential surface which bridges outer circumferential edges of the first surface and the second surface,
- a plurality of light-emitting elements mounted on the second surface of the substrate, and
- a pressure member which elastically presses the substrate toward the body, with a gap provided between the pressure member and the outer circumferential surface of the substrate.

5. The illumination device of claim 4, wherein
the pressure member of the light-emitting device is a metal plate spring,
the plate spring comprises a fixing part fixed to the body, a pressure part in elastic contact with the second surface of the substrate, and a rising part bridging the fixing part and the pressure part, and
the gap is provided between the rising part and the outer circumferential surface of the substrate.

6. The illumination device of claim 5, wherein the light-emitting device further comprises a power supply terminal provided on the second surface of the substrate, and the pressure part is in elastic contact with the power supply terminal.

7. The illumination device of claim 4, wherein the light-emitting device further comprises a power supply terminal provided on the second surface of the substrate, and the pressure member of the light-emitting device comprises a holder supported on the body and an elastically deformable contact element provided on the holder, and
the gap is provided between the holder and the outer circumferential surface of the substrate, and the contact element makes elastic contact with the power supply terminal, thereby applying a load to the substrate toward the body.

* * * * *